(12) United States Patent
Liaw

(10) Patent No.: US 7,092,309 B2
(45) Date of Patent: Aug. 15, 2006

(54) STANDBY MODE SRAM DESIGN FOR POWER REDUCTION

(75) Inventor: Jhon Jhy Liaw, Hsin-Chu (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 167 days.

(21) Appl. No.: 10/836,408

(22) Filed: Apr. 30, 2004

(65) Prior Publication Data

US 2005/0243634 A1 Nov. 3, 2005

(51) Int. Cl.
*G11C 7/00* (2006.01)
(52) U.S. Cl. .................. 365/229; 365/227; 365/189.09
(58) Field of Classification Search ................. 365/229, 365/226, 227, 230.06, 189.09; 327/535, 327/537

See application file for complete search history.

(56) References Cited

U.S. PATENT DOCUMENTS

| | | | | |
|---|---|---|---|---|
| 6,046,627 A | * | 4/2000 | Itoh et al. .................... | 327/546 |
| 6,067,256 A | * | 5/2000 | Yamashita et al. ...... | 365/189.04 |
| 6,212,124 B1 | * | 4/2001 | Noda ..................... | 365/230.06 |
| 6,294,404 B1 | * | 9/2001 | Sato ........................... | 438/106 |
| 6,683,805 B1 | * | 1/2004 | Joshi et al. ................. | 365/156 |
| 6,738,305 B1 | * | 5/2004 | Liaw .......................... | 365/229 |
| 2004/0252573 A1 | * | 12/2004 | Hanson et al. .............. | 365/229 |

* cited by examiner

*Primary Examiner*—Gene N. Auduong
(74) *Attorney, Agent, or Firm*—Duane Morris LLP

(57) ABSTRACT

A method and system is disclosed for controlling power supply to a memory device. After determining at least one word line being selected, supply voltage lines are controlled so that a predetermined active mode voltage is provided to one or more predetermined memory cells associated with the selected word line, and a standby voltage lower than the active mode voltage is provided to all other unselected portions of the memory device.

22 Claims, 5 Drawing Sheets

STANDBY MODE SRAM DESIGN FOR POWER REDUCTION

BACKGROUND

The present disclosure relates generally to electronic memory circuits, and more particularly to complementary metal oxide semiconductor (CMOS) static random access memories (SRAM). Still more particularly, the present disclosure relates to methods of placing these memories in, and of recovering these circuits from, a standby mode.

Electronic memory circuits have been known for many years. Such memory circuits have employed a wide variety of types of circuits and circuit elements in order to store information in some way, such as by storage of charge in a capacitive element or the use of a bistable circuit or element. Such a bistable element can take the form, for example, of the well-known flip-flop circuit, where a pair of transistors are cross-coupled in such a way that when one transistor is turned on, the other will be forced off, or a magnetizable core or other element or domain which can be selectively magnetized into one of at least two distinct states.

Each of these memory types, categorized by the type of memory cell employed, has distinct advantages and disadvantages with respect to the other types of memory and each type will typically be applied where the advantages can be best utilized.

With widespread use of electronic devices for operating portable appliances such as portable telephones, personal digital assistants (PDA), portable information terminals, AV devices and others on batteries, it is becoming more important to decrease both power consumption during operation and power consumption during device standby mode.

In recent years, there has been an interest in increasing the memory capacity of all types of memory devices, including static memory devices. Some particular problems are encountered in doing so in SRAMs because the size of each memory cell on the chip is much larger than in dynamic RAMs due to the use of a greater number of circuit elements in each memory cell. SRAMs have the advantage over dynamic RAMs by demonstrating significantly higher switching speeds and have the ability to be put in a standby mode, which significantly reduces total memory current.

SRAMs are comprised of gate-insulated field-effect transistors, or MOS transistors. These transistors require an operating voltage that decreases as the transistor size decreases, because the breakdown voltage of the transistor decreases with the smaller size. As well, the threshold voltage (VT) of the MOS transistor must be lowered in accordance with the drop of operating voltage so as to retain high-speed operation, because the operating speed is dominated by the effective gate voltage of the MOS transistor (i.e., the operating voltage minus VT), and increases as the difference increases.

Generally speaking, however, if the VT is lower than about 0.4 V, a direct sub-threshold current, which exponentially increases with the drop in VT, will flow through the MOS transistor, which should intrinsically be cut off. As a result, the direct current greatly increases in a semiconductor integrated circuit composed of a number of MOS transistors, even if the circuit is a CMOS circuit. This sub-threshold current is significant when multiplied by the large number of memory cells in current memory arrays and produces undesirable standby power consumption during standby.

The most popular and simplest method of reducing power involves reducing the applied operating voltage to the entire memory during the standby mode. This approach requires a longer charge time to retrieve the first information from the memory upon recovery from the standby mode. It also requires a high current charging current during the switching from the standby to operating condition. For large bit density SRAMs, lower power consumption is important for device thermal stability, power bus design and product specification. Thus a standby circuit model is widely used in SRAM circuit design.

Desirable in the art of semiconductor memory design are method and circuit designs for operating devices under their standby mode.

SUMMARY

In view of the foregoing, this disclosure provides a system and method for reducing power for static random access memories.

A method and system are disclosed for controlling power supply to a memory device. After determining at least one word line being selected, supply voltage lines are controlled so that a predetermined active mode voltage is provided to one or more predetermined memory cells associated with the selected word line, and a standby voltage lower than the active mode voltage is provided to all other unselected portions of the memory device.

Various aspects and advantages will become apparent from the following detailed description, taken in conjunction with the accompanying drawings, illustrating the principles of the disclosure by way of examples.

DESCRIPTION

The present disclosure provides an improved system and method for reducing power for static random access memories. A new standby mode operation is proposed in order to eliminate the first bit read or write delay time issue, to minimize the charge current, and to reduce the standby power consumption. For illustration purposes, SRAM is used as an example, although it is understood that similar memory devices can also be used.

The present disclosure provides control circuits to manage memory power supply (or Vcc) lines. Only selected word lines of an SRAM is powered up to a full operating voltage level (e.g., Vdd), which may be referred to as an active mode voltage, while other unselected word lines are supplied with a lower voltage level, which may be referred to as a standby voltage. Unlike the conventional designs, only a small portion of the SRAM suffers from higher standby leakage problem due to the fact that not all memory cells are supplied with the active mode voltage.

Figure 1:
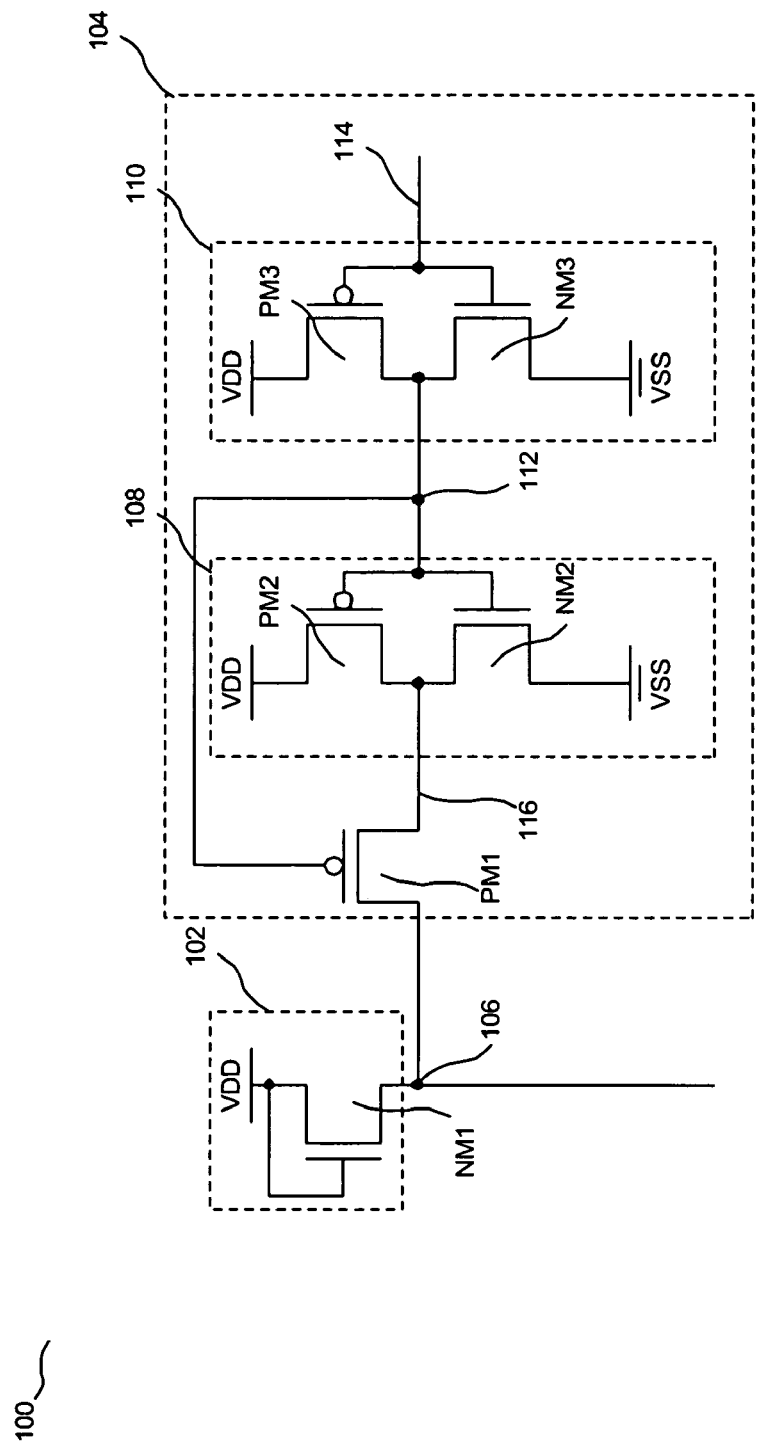
FIG. 1 illustrates a first embodiment of a control circuit in accordance with the first example of the present disclosure.

FIG. 1 illustrates a control circuit 100, which includes a first control module 102 and a second control module 104. The first control module 102 includes an NMOS transistor NM1, whose gate is connected to its drain and whose source is connected to an output node 106. The second control module 104 includes a PMOS transistor PM1 and inverters 108 and 110. Inverter 108 includes a PMOS transistor PM2 and an NMOS transistor NM2, while inverter 110 includes a PMOS transistor PM3 and an NMOS transistor NM3. The output of the inverter 110 is connected, via a node 112, to the input of the inverter 108. Node 112 also connects to the gate of transistor PM1. The input of the inverter 110 is driven, via a node 114, by a word line select signal. The output of inverter 108 connects to a node 116, which also connects to the source of PM1, whose drain connects to the output node 106. The output node 106 is then connected to a power supply line or a Vcc line for a word line of the SRAM array to supply power thereto.

If the word line is supposed to be in an active mode, it is assumed that the word line select signal switches to high (logic 1), node 114 is high and node 112 is low (logic 0). Since node 112 is connected to the gate of PM2, PM2 is turned on, thereby passing a full operating voltage Vdd (or the active mode voltage) to node 116. Also, since node 112 is connected to the gate of PM1, PM1 is turned on, thereby allowing Vdd at node 116 to pass to node 106. As such, the control circuit 100 acts as a switched power supply to the connected individual word line. That is, when an individual word line is selected, node 114 is high and Vdd is eventually passed to the output node 106 for supplying the selected word line with a predetermined high voltage.

If the word line is supposed to be in a standby mode, in this example, the word line select signal switches to low, node 114 is low and Vdd is not passed to node 106. Instead, a regulated voltage or the standby voltage, which is lower than Vdd, is generated by the first control module 102 and passed to the output node 106. This regulated voltage is calculated as the difference between Vdd and the threshold voltage of NM1, or $VT_{NM1}$. When word line select signal switches to high, the regulated voltage is supplanted by the full operating voltage that is supplied by the second control module 104. As such, for each word line of the SRAM array, it is only supplied by the full operating voltage Vdd when the word line is specifically selected. Otherwise, a voltage at a lower level is supplied. This reduces the current leakage problem during the standby mode since only a relatively small localized area of the SRAM array is powered up to the full operating voltage.

Figure 2:
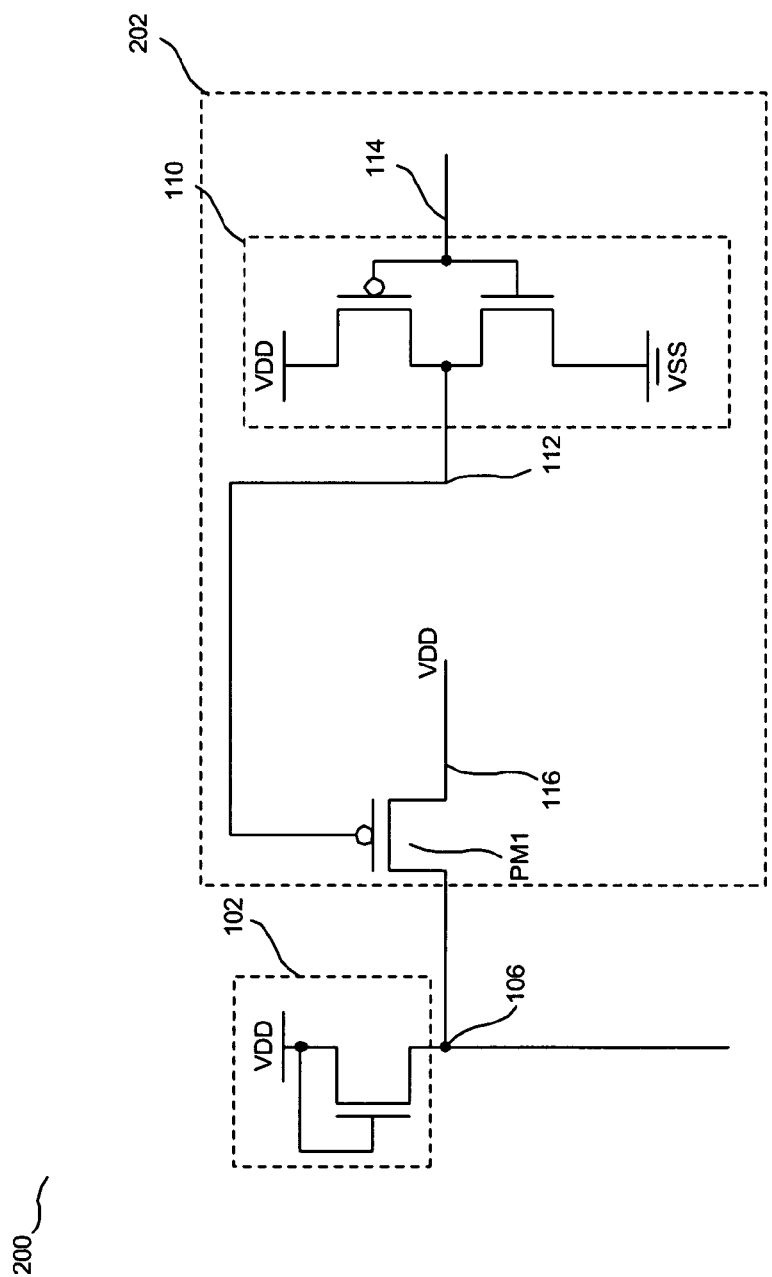
FIG. 2 illustrates a second embodiment of a control circuit in accordance with the first example of the present disclosure.

FIG. 2 illustrates a control circuit 200, which includes the first control module 102 and a second control module 202. The second control module 202 is similar to the control module 104 of FIG. 1 except that the inverter 108 is eliminated. In other words, the second control module 202 includes the transistor PM1 and the inverter 110. The node 116, instead of connecting to the output of the inverter 110, it is now connected to Vdd. Like the control circuit 100, the drain of the transistor PM1 is connected to the output node 106. Similarly, node 112 is connected to the gate of transistor PM1. In other words, the output of the inverter 110 is applied directly to the gate of PM1.

As in FIG. 1, when an individual word line is selected, node 114 is high and node 112 is low. Since node 112 is connected to the gate of PM1, PM1 is turned on, thereby passing Vdd to node 106. In this embodiment, control circuit 200 functions in the same manner as the control circuit 100, except that control circuit 200 passes current through only one PMOS transistor, and as a result exhibits turn-on timing difference. Also circuit layout area is reduced due to the absence of the inverter 108.

Figure 3:
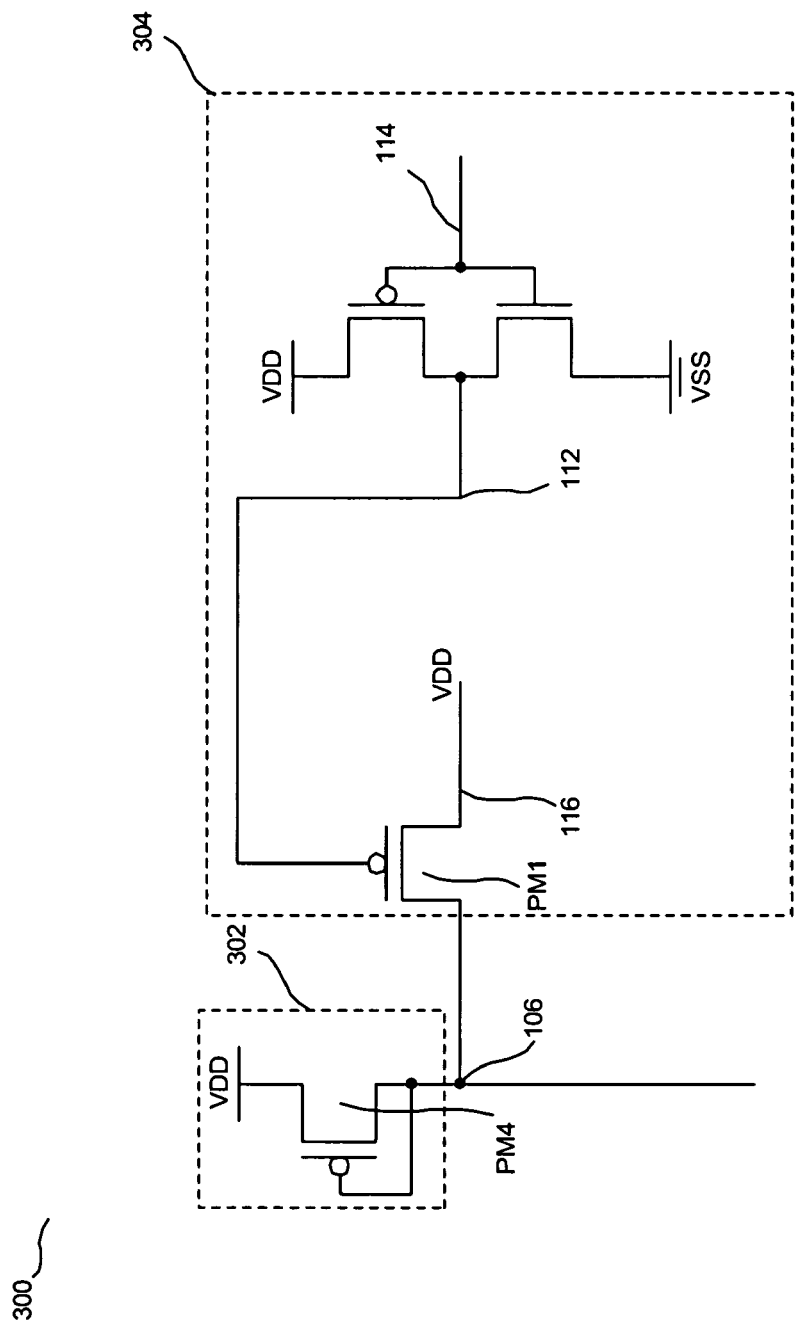
FIG. 3 illustrates a third embodiment of a control circuit in accordance with the first example of the present disclosure.

FIG. 3 illustrates a control circuit 300, which includes a first control module 302 and a second control module 304. In this example, the first control module 302 includes only a PMOS transistor PM4, whose source is connected to Vdd and whose gate is connected to its drain. The drain of PM4 is also connected to the output node 106. During the standby mode with the word line deselected, node 114 is low and the node 112 is high, thereby turning off PM1. A regulated voltage, which is the difference between Vdd and the threshold voltage of PM4, or $V_{PM4}$, is supplied to the output node 106. As such, the deselected word lines are supplied with a reduced voltage supply in the standby mode to reduce standby power and leakage current. When the word line is selected, node 114 is high and node 112 is low, thereby turning on PM1. Vdd is then passed to the output node 106, which supplants the regulated voltage generated by the first control module 302.

As illustrated above in various examples, the designs for the first control module and the second control module are relatively independent. For example, the first control module can use the NMOS design as well as the PMOS design, and the second control module can use any appropriate one to operate with the first control module. Further, the separation of the first and second control modules are artificial for illustration purposes as they are all parts of an integrated control circuit.

Figure 4:
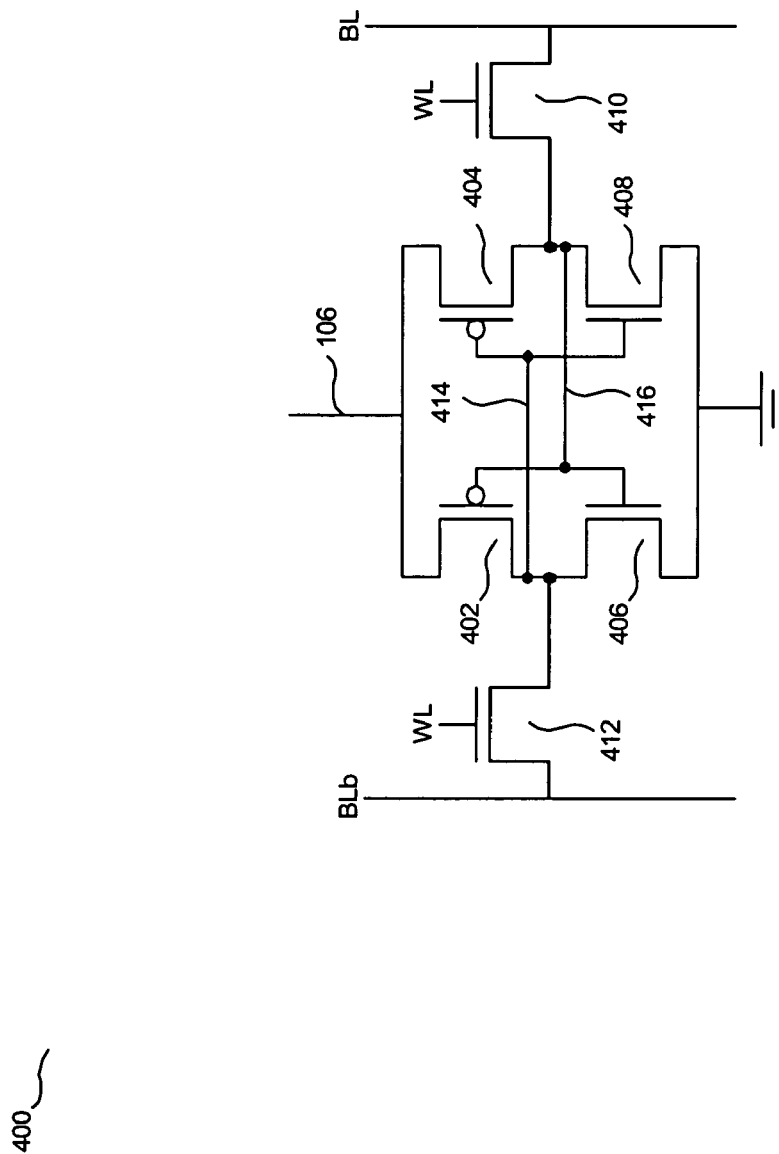
FIG. 4 illustrates a typical memory cell.

FIG. 4 shows a typical CMOS single memory cell 400, which includes PMOS transistors 402 and 404, and NMOS transistors 406, 408, 410 and 412. The operating power of this cell is supplied via node 106, which is the output node from the control circuit as described above. When a word line WL is selected, the logic states stored in nodes 414 and 416 will be passed, respectively, to bitlines BLb and BL. As explained above, when the operating power of this cell is reduced during the standby mode, current leakage problem is minimized. It is understood that any memory cell design can work with the above described control circuit as long as it receives a controlled supply voltage that is lowered during the standby mode. For example, in another typical memory cell design, PMOS transistors 402 and 404 are each replaced with a high valued poly silicon resistor. Because the resistor may be constructed on top of the rest of the transistors, significant space may be saved.

Figure 5:
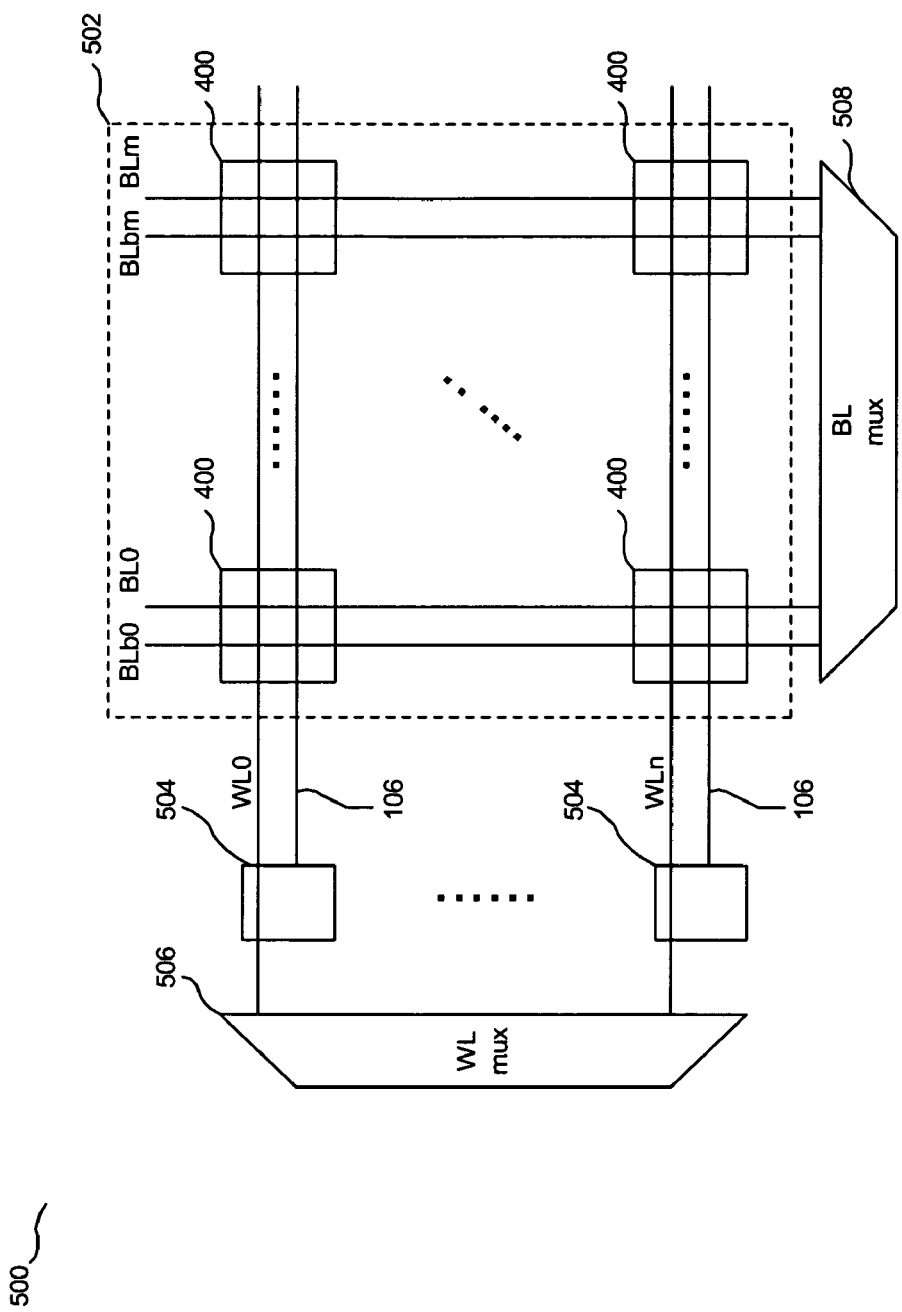
FIG. 5 illustrates a memory design in accordance with the first example of the present disclosure.

FIG. 5 shows a memory 500 in accordance with one example of the present disclosure. A memory array 502 includes an array of memory cells 400 with n rows and m columns, interconnecting with each other through word lines WL0 to WLn and bitlines BLb0/BL0 to BLbm/BLm. A plurality of power supply circuits 504 is used to provide power to the memory array 502. Any one of the control circuits 100, 200 or 300 may be implemented as the power supply circuit 504 to achieve the same function. The control circuits 100, 200 and 300 provide the same effective result with slight differences in timing. Each power supply circuit is connected, via its output node, to the memory array 502.

One of the word lines WL0 to WLn is first selected by a word line multiplex circuit 506, after which voltage is generated by the corresponding power supply circuit 504 and passed, via the output node, to the memory array 502. The bitlines are further selected by a bitline multiplex circuit 508. Therefore, the word line by the word line multiplex circuit 506 is supplied with a full operating voltage, or Vdd. Other word lines in standby mode receive a regulated voltage, which is smaller than Vdd, from the power supply circuit 504.

The above disclosure provides many different embodiments, or examples, for implementing different features of the disclosure. Specific examples of components, and processes are described to help clarify the disclosure. These are, of course, merely examples and are not intended to limit the disclosure from that described in the claims.

Although illustrative embodiments of the disclosure have been shown and described, other modifications, changes, and substitutions are intended in the foregoing disclosure. Accordingly, it is appropriate that the appended claims be construed broadly and in a manner consistent with the scope of the disclosure, as set forth in the following claims.

What is claimed is:

1. A control circuit for controlling a power supply of a memory array, comprising:
   an input representing a word line of the memory array being selected;
   a second control module for providing an active mode voltage to one or more predetermined memory cells associated with the selected word line;
   a first control module for providing the memory cells with a standby voltage lower than the active mode voltage when the word line is not selected; and
   an output node for delivering either the standby voltage or the active mode voltage to the memory cells based on the input.

2. The circuit of claim 1 wherein the predetermined active mode voltage is a full operating voltage of the memory array.

3. The circuit of claim 1 wherein the first control module is a transistor passing the active mode voltage therethrough, thereby causing the standby voltage to be less than the active mode voltage by an amount that is substantially equal to its threshold voltage.

4. The circuit of claim 3 wherein the first control module is a PMOS transistor with its source connected to the active mode voltage and its gate and drain tied together for providing the standby voltage.

5. The circuit of claim 3 wherein the first control module is an NMOS transistor with its drain and gate connected to the active mode voltage and with its source providing the standby voltage.

6. The circuit of claim 1 wherein the second control module further includes a first inverter for receiving the input and producing an inverter output for controlling a passing of the active mode voltage to the output node.

7. The circuit of claim 6 wherein the second control module further includes a second inverter for receiving the inverter output from the first inverter and producing the active mode voltage from the input to be passed to the output node.

8. A static random access memory (SRAM) device comprising:
   one or more memory cells connectable to one or more supply voltage lines;
   one or more decoding modules for selecting at least one word line;
   one or more control circuits for controlling the supply voltage lines so that a predetermined active mode voltage is provided to one or more predetermined memory cells associated withh the selected word line, and a standby voltage lower than the active mode voltage is provided to all other unselected memory cells of the memory module.

9. The memory device of claim 8 wherein a control circuit is coupled withh each supply voltage line.

10. The memory device of claim 8 wherein the control module further includes:
    an input representing a predetermined word line being selected; and
    an output node for providing either the standby voltage or the active mode voltage based on the input.

11. The memory device of claim 10 wherein the control circuit further inojudes a first control module for providing the standby voltage and a second control module for providing the active mode voltage.

12. The memory device of claim 11 wherein the first control module is a transistor passing a full operating voltage therethrough, thereby causing the standby voltage to be less than the full operating voltage by an amount that is substantially equal to its threshold voltage.

13. The memory device of claim 12 wherein the first control module is a PMOS transistor with its source connected to the active mode voltage and its gate and drain tied together for providing the standby voltage.

14. The memory device of claim 12 wherein the first control module is an NMOS transistor with its drain and gate connected to the active mode voltage and withh its source providing the standby voltage.

15. The memory device of claim 11 wherein the second control module further includes a first inverter for receiving the input and producing an inverter output for controlling a passing of a full operating voltage to the output node.

16. The memory device of claim 15 wherein the second control module further includes a second inverter for receiving the inverter output from the first inverter and producing the active mode voltage from the input to be passed to the output node.

17. A method for controlling a static random access memory (SRAM) module, the SRAM module having one or more memory cells connectable to one or more supply voltage lines, the method comprising:
    determining at least one word line being selected; and
    controlling the supply voltage lines so that a predetermined active mode voltage is provided to one or more predetermined memory cells associated with the selected word line, said active mode voltage being a full operating voltage of said SRAM module, and a standby voltage lower than the active mode voltage is provided to all other unselected portions of the SRAM module.

18. The method of claim 17 wherein the controlling further includes controlling each supply voltage line through a control circuit.

19. The method of claim 17 wherein the controlling further includes:
    deriving a predetermined select signal representing a word line being selected; and
    providing through a first control module the standby voltage and through a second control module the active mode voltage to an output node based on the derived select signal.

20. The method of claim 19 wherein the providing further includes passing a full operating voltage through a transistor, thereby causing the standby voltage to be less than the fully operating voltage by an amount that is substantially equal to its threshold voltage.

21. The method of claim 19 wherein the providing further includes receiving the select signal at a first inverter and producing an inverter output for controlling a passing of a full operating voltage to be the active mode voltage.

22. The method of claim 21 wherein the providing further includes receiving the inverter output from the first inverter at a second inverter and producing the active mode voltage from the select signal to be the active mode voltage.

* * * * *

UNITED STATES PATENT AND TRADEMARK OFFICE
CERTIFICATE OF CORRECTION

PATENT NO. : 7,092,309 B2  
APPLICATION NO. : 10/836408  
DATED : August 15, 2006  
INVENTOR(S) : Jhon Jhy Liaw Page 1 of 1

It is certified that error appears in the above-identified patent and that said Letters Patent is hereby corrected as shown below:

Column 5, line 55, delete "withh" and insert therefor -- with --.

Column 5, line 60, delete "withh" and insert therefor -- with --.

Column 6, line 2, delete "inojudes" and insert therefor -- includes --.

Column 6, line 16, delete "withh" and insert therefor -- with --.

Column 6, line 54, delete "fully" and insert therefor -- full --.

Signed and Sealed this

Seventeenth Day of July, 2007

JON W. DUDAS  
*Director of the United States Patent and Trademark Office*